US011222946B2

(12) United States Patent
Yin et al.

(10) Patent No.: US 11,222,946 B2
(45) Date of Patent: Jan. 11, 2022

(54) SEMICONDUCTOR DEVICE INCLUDING A HIGH DENSITY MIM CAPACITOR AND METHOD

(71) Applicant: Taiwan Semiconductor Manufacturing Company, Ltd., Hsinchu (TW)

(72) Inventors: Jin-Mu Yin, Kaohsiung (TW); Hung-Chao Kao, Taipei (TW); Dian-Hau Chen, Hsinchu (TW); Hui-Chi Chen, Zhudong Township (TW); Hsiang-Ku Shen, Hsinchu (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/400,860

(22) Filed: May 1, 2019

(65) Prior Publication Data

US 2020/0176557 A1 Jun. 4, 2020

Related U.S. Application Data

(60) Provisional application No. 62/773,574, filed on Nov. 30, 2018.

(51) Int. Cl.
*H01L 49/02* (2006.01)
(52) U.S. Cl.
CPC .............. *H01L 28/91* (2013.01); *H01L 28/75* (2013.01); *H01L 28/92* (2013.01)

(58) Field of Classification Search
CPC ................................................ H01L 28/75–92
See application file for complete search history.

(56) References Cited

U.S. PATENT DOCUMENTS

| 6,974,993 | B2 | 12/2005 | Coursey | |
|---|---|---|---|---|
| 7,045,844 | B2 | 5/2006 | Brown | |
| 2010/0219502 | A1* | 9/2010 | Shieh | H01L 28/40 257/532 |
| 2011/0165751 | A1* | 7/2011 | Choi | H01L 28/90 438/381 |
| 2012/0012979 | A1* | 1/2012 | Horak | H01L 21/3105 257/532 |
| 2013/0134557 | A1* | 5/2013 | Abou-Khalil | H01L 28/82 257/534 |

(Continued)

*Primary Examiner* — Walter H Swanson
(74) *Attorney, Agent, or Firm* — Slater Matsil, LLP

(57) ABSTRACT

Methods of forming a 3-dimensional metal-insulator-metal super high density (3D-MIM-SHD) capacitor and semiconductor device are disclosed herein. A method includes depositing a base layer of a first dielectric material over a semiconductor substrate and etching a series of recesses in the base layer. Once the series of recesses have been etched into the base layer, a series of conductive layers and dielectric layers may be deposited within the series of recesses to form a three dimensional corrugated stack of conductive layers separated by the dielectric layers. A first contact plug may be formed through a middle conductive layer of the corrugated stack and a second contact plug may be formed through a top conductive layer and a bottom conductive layer of the corrugated stack. The contact plugs electrically couple the conductive layers to one or more active devices of the semiconductor substrate.

20 Claims, 9 Drawing Sheets

(56) References Cited

U.S. PATENT DOCUMENTS

| | | | |
|---|---|---|---|
| 2014/0203400 A1* | 7/2014 | Kobrinsky | H01L 21/0337 |
| | | | 257/532 |
| 2017/0317161 A1* | 11/2017 | Yan | H01L 21/76283 |
| 2018/0197946 A1* | 7/2018 | Leobandung | H01L 23/5223 |
| 2019/0393298 A1* | 12/2019 | Lin | H01L 28/75 |

* cited by examiner

SEMICONDUCTOR DEVICE INCLUDING A HIGH DENSITY MIM CAPACITOR AND METHOD

PRIORITY CLAIM AND CROSS-REFERENCE

This application claims the benefit of U.S. Provisional Application No. 62/773,574, filed on Nov. 30, 2018, which application is hereby incorporated herein by reference.

BACKGROUND

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage; while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

Decoupling capacitors are used to decouple some parts of electrical networks from others. Noise caused by certain circuit elements is shunted through the decoupling capacitors, hence reducing the effect of the noise-generating circuit elements on adjacent circuits. In addition, decoupling capacitors are also used in power supplies, so that the power supplies may accommodate the variations in current-draw, so that the variation in power supply voltage is minimized. When the current-draw in a device changes, the power supply itself cannot respond to the change instantaneously. The decoupling capacitors thus may act as power storages to maintain power supply voltages in response to the current-draw.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative design techniques of electronic components in semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-5A illustrate cross-sectional views of intermediate stages in the formation of a capacitor within a semiconductor die, in accordance with some embodiments.

DETAILED DESCRIPTION

Figure 1:
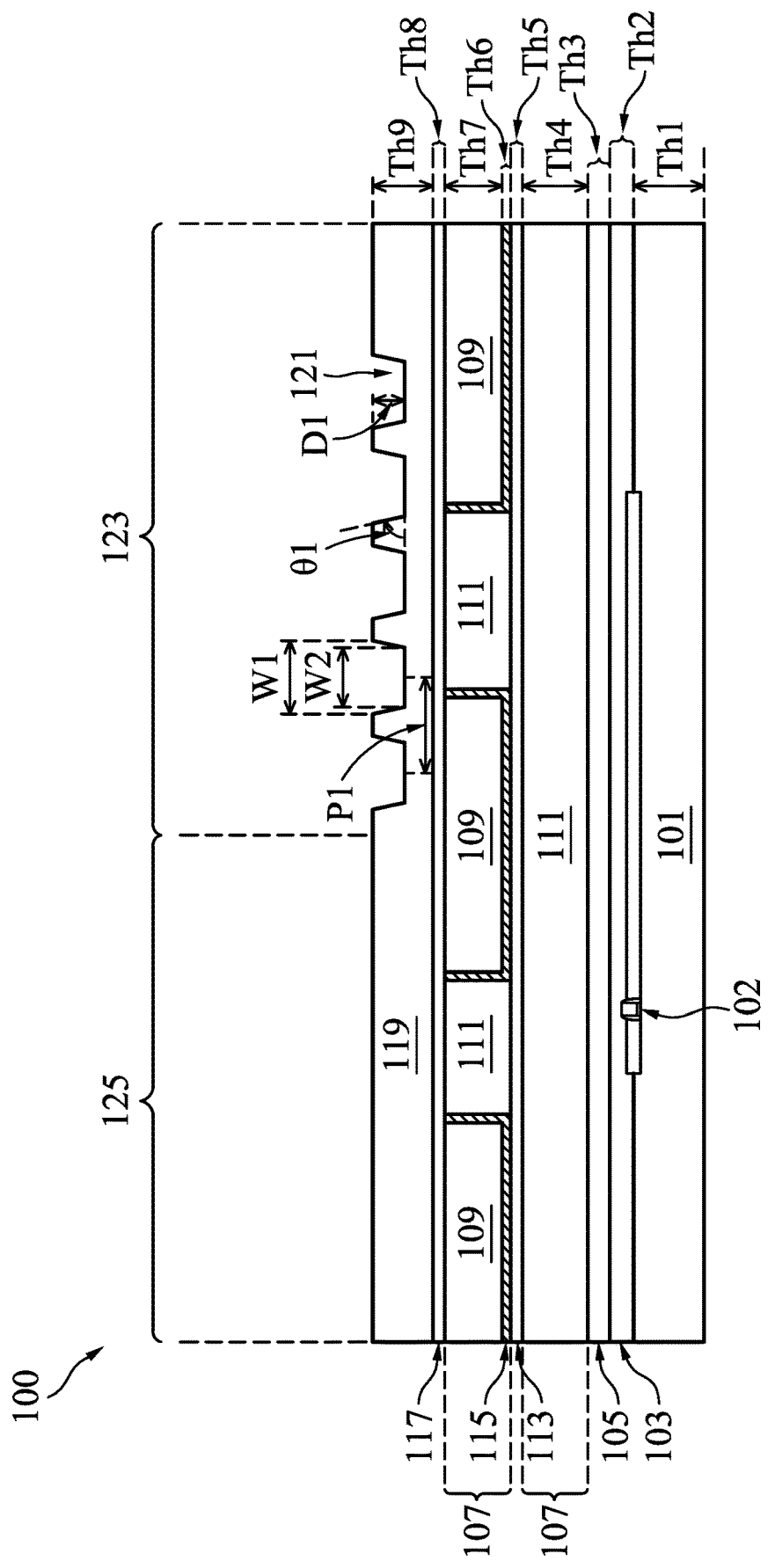

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor die/wafer including a capacitor and the method of forming the same are provided in accordance with some exemplary embodiments. The intermediate stages of forming the capacitor are illustrated. The variations of the embodiments are discussed. Throughout the various views and illustrative embodiments, like reference numbers are used to designate like elements.

Methods of forming a 3-dimensional metal-insulator-metal super high density (3D-MIM-SHD) capacitor and semiconductor device are disclosed herein. A method includes depositing a base layer of a first dielectric material over a semiconductor substrate and etching a series of recesses in the base layer. Once the series of recesses have been etched into the base layer, a series of conductive layers and dielectric layers may be deposited within the series of recesses to form a three dimensional corrugated stack of conductive layers separated by the dielectric layers. A first contact plug may be formed through a middle conductive layer of the corrugated stack and a second contact plug may be formed through a top conductive layer and a bottom conductive layer of the corrugated stack. The contact plugs electrically couple the conductive layers to one or more active devices of the semiconductor substrate.

FIGS. 1 through 5 illustrate cross-sectional views of intermediate stages in the formation of a capacitor in a semiconductor die of a wafer in accordance with some embodiments of the present disclosure. With reference now to FIG. 1, there is shown a cross-sectional view of an intermediate stage in the formation of a semiconductor device with a substrate 101, active devices 102 on the substrate 101, an interlayer dielectric (ILD) layer 103 over the active devices 102, and metallization layers 107 over the ILD layer 103. The substrate 101 may be substantially conductive or semiconductive with an electrical resistance of less than 103 ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the substrate 101 at this point in the process may be part of a semiconductor wafer that will be singulated in a later step. In an embodiment, the semiconductor substrate 101 has a thickness Th1 of between about 700 μm and about 800 μm, such as about 775 μm. However, any suitable thickness may be used for the substrate 101.

The active devices 102 are represented in FIG. 1 as a single transistor. However, as one of skill in the art will recognize, a wide variety of active devices such as finFETs, capacitors, resistors, inductors and the like may be used to generate the desired structural and functional requirements of the design for the semiconductor device. The active devices 102 may be formed using any suitable methods either within or else on the surface of the substrate 101.

The ILD layer 103 may comprise a material such as boron phosphorous silicate glass (BPSG), although any suitable dielectrics may be used. The ILD layer 103 may be formed using a process such as PECVD, although other processes, such as LPCVD, may alternatively be used. According to some embodiments, the ILD layer 103 may be formed to a thickness Th2 of about 2000 Å. However, any suitable material and any suitable thickness may be used for the ILD layer 103.

An inter-metal dielectric (IMD) layer 105 may be formed over and in contact with the ILD layer 103, according to some embodiments. The IMD layer 105 may be formed of a dielectric material such as silicon carbide (SiC), silicon nitride (SiN), silicon oxynitride (SiON), silicon carbo-nitride (SiCN), or the like. According to an embodiment, the IMD layer 105 may be formed to a thickness Th3 of about 550 Å. However, any suitable material and any suitable thickness may be used for the IMD layer 105.

The metallization layers 107 are formed over the substrate 101, the active devices 102, the ILD layer 103, the IMD layer 105 (if used) and are designed to connect the various active devices 102 to form functional circuitry. The metallization layers 107 comprise a plurality of conductive structures formed within alternating layers of dielectric material 111 that separate portions of the conductive structures of neighboring layers of the alternating layers of dielectric material 111 from one another. The dielectric material 111 of the metallization layers 107 may include conductive vias and/or gaps that allow contact areas of conductive structures formed within neighboring layers of the alternating layers of dielectric material 111 of the metallization layers 107 to electrically couple to one another through the dielectric material 111 of the metallization layers 107.

The metallization layers 107 may be formed through any suitable process (such as deposition, damascene, dual damascene, etc.). In an embodiment there may be two metallization layers 107 separated from the substrate 101 by the ILD layer 103, but the precise number of metallization layers 107 is dependent upon the design of the semiconductor device.

According to an embodiment, the alternating layers of dielectric material 111 of the metallization layers 107 may comprise one or more materials such as undoped silicate glass (USG), although any suitable dielectrics may be used. The first metal layer 107 may be formed using a chemical vapor deposition (CVD) process such as plasma enhanced CVD (PECVD). Although other processes, such as Low pressure CVD (LPCVD), High Density Plasma CVD (HDP-CVD) or Sub-Atmospheric Pressure CVD (SACVD), may also be used. The first metal layer 107 may be formed to a thickness Th4 of about 6200 Å. However, any suitable material and any suitable thickness may be used for the first metal layer 107.

According to some embodiments, a passivation layer 113 may be formed over and in contact with one or more of the metallization layers 107. The passivation layer 113 may be formed of silicon carbide, silicon nitride, silicon oxynitride, silicon carbo-nitride, or the like. The passivation layer 113 is formed by depositing a material that has a high etching selectivity relative to an overlying dielectric layer 111 of the metallization layers 107, and hence the passivation layer 113 may be used to stop the etching of the overlying dielectric layer 111. According to an embodiment, the passivation layer 113 may comprise silicon nitride (SiN) and may be formed to a thickness Th5 of about 500 Å. However, any suitable material, any suitable deposition process and any suitable thickness may be used for the passivation layer 113.

The passivation layer 113 separates portions of the conductive structures of neighboring metallization layers 107 from one another. The passivation layer 113 may include conductive vias and/or gaps that allow contact areas of neighboring metallization layers 107 to electrically couple to one another through the passivation layer 113. In an embodiment there may be two metallization layers 107 separated from one another by the passivation layer 113 and separated from the substrate 101 by the ILD layer 103, but the precise number of metallization layers 107 is dependent upon the design of the semiconductor device.

According to some embodiments, a top layer of the metallization layers 107 comprises a plurality of conductive lines 109 surrounded by a dielectric layer 111. In an embodiment the conductive lines 109 comprise a conductive material, such as copper (Cu) or other suitable conductor, formed within the dielectric layer 111, which may be any suitable dielectric, such as a low-k dielectric material. The dielectric layer 111 of the top layer may be initially formed over the remainder of the metallization layers 107 and then conductive lines 109 may be formed within the dielectric layer 111 using, e.g., a damascene or dual damascene process, although any suitable process or materials may be used.

According to some embodiments, the conductive lines 109 include diffusion barrier layers 115. The diffusion barrier layers 115 are formed in the dielectric layer 111 during, e.g., the damascene or dual damascene process used to form the conductive lines 109 within the dielectric layer 111. For example, during a damascene process, trenches are formed in the dielectric layer 111 to a desired depth and shape of the conductive features to be formed therein. As such, a surface of the dielectric layer 111 becomes contoured by the profile of the trenches formed within the dielectric layer 111. Once the openings are formed, a diffusion barrier material is deposited over and conforms to the contoured surface of the dielectric layer 111. In some embodiments, the material of the diffusion barrier layers 115 may include titanium (Ti), titanium nitride (TiN), tantalum (Ta), tantalum nitride (TaN), or the like and the diffusion barrier layers 115 may be formed to a thickness Th6 of between about 100 Å and about 200 Å. However, any suitable material and any suitable thickness may be used for the diffusion barrier layers 115.

Once the diffusion barrier layers 115 have been deposited, a conductive fill material (e.g., copper (Cu)) is deposited over the diffusion barrier layers 115 and, in some embodiments, the conductive fill material may be deposited such that remaining portions of the trenches are overfilled to a level above the planar surface of the dielectric layer 111. Once deposited, a planarization process (e.g., chemical mechanical polishing (CMP)) may be performed to remove excess portions of the diffusion barrier layer 115 and excess portions of the conductive fill material extending over the planar surface of the dielectric layer 111. As such, the conductive lines 109 including the diffusion barrier layers 115 are formed within the dielectric layer 111 of the top layer of the metallization layers 107, as illustrated in FIG. 1. The diffusion barrier layers 115 have the function of preventing the conductive material (e.g., copper (Cu)) of the conductive lines 109 from diffusing into the dielectric layer 111. In some embodiments, the conductive lines 109 may be formed to a thickness Th7 of between about 8000 Å and about 9000 Å, such as about 8500 Å. However, any suitable material and any suitable thickness may be used for the conductive lines 109.

A hard mask layer 117 may be formed as a blanket layer of dielectric material over the top layer of the metallization layers 107, thereby isolating the conductive lines 109 from any subsequently formed layer. The hard mask layer 117 may be deposited using plasma enhance chemical vapor deposition (PECVD), low-pressure chemical vapor deposition (LPCVD), atomic layer deposition (ALD), or the like. However, any suitable material, any suitable thickness and any suitable method may be utilized to form the hard mask layer 117. In accordance with some embodiments, the hard mask layer 117 is formed as a dielectric layer of silicon nitride (SiN) to a thickness Th8 of about 750 Å. However, any suitable material and any suitable thickness may be used for the hard mask layer 117.

FIG. 1 further illustrates the formation and patterning of a base dielectric layer 119. In an embodiment, the base dielectric layer 119 may be formed as a plasma enhanced oxide undoped silicon glass (PEOX-USG) to a thickness Th9 of between about 2000 Å and about 3000 Å. The base dielectric layer 119 may be formed as a blanket layer over the hard mask layer 117 using Plasma Enhance Chemical Vapor Deposition (PECVD), Low-Pressure Chemical Vapor Deposition (LPCVD), Atomic Layer Deposition (ALD), or the like. However, any suitable material, any suitable thickness and any suitable method may be utilized to form the base dielectric layer 119.

The base dielectric layer 119 may be patterned using any suitable lithographic process to pattern a plurality of recesses 121 within an upper surface of the base dielectric layer 119. Once patterned, the areas of the upper surface of the base dielectric layer 119 comprising the plurality of recesses 121 may be referred to herein as a corrugated region 123 of the device layer, whereas other areas of the upper surface of the base dielectric layer 119 may be referred to herein as a planar region 125 of the device layer. In an embodiment, a photo resist layer may be deposited and patterned to expose areas of the base dielectric layer 119 to be removed in order to form the plurality of recesses 121 in the corrugated region 123. The exposed areas of the base dielectric layer 119 are subjected to an etching process (e.g., a plasma enhanced etch using a first process gas comprising tetrafluormethane ($CF_4$)) to remove portions of the base dielectric layer 119. All, some or none of the photo resist layer may be consumed during the etching of the base dielectric layer 119 and any remaining photo resist material may be removed, e.g., by an ashing process. However, any suitable material, any suitable deposition and any suitable removal process may be utilized for the photo resist and any suitable etching process may be utilized to form the plurality of recesses 121.

In an embodiment, a series of five recesses 121 are formed in the upper surface of the base dielectric layer 119, thereby defining the corrugated region 123 of the base dielectric layer 119. The series of five recesses 121 are spaced a same distance apart at a pitch P1. However, any suitable number of the recesses 121 may be formed in the base dielectric layer 119 and any suitable pitch P1 may be used for the spacing between the recesses 121. Although examples are provided of the recesses 121 being regularly spaced apart and having the same pitch between recesses 121, it is to be understood that the recesses 121 may be irregularly spaced apart having different pitches between recesses 121 and all combinations thereof apply to the embodiments disclosed herein.

According to an embodiment, the recesses 121 of the series are formed to have a same pitch P1, to have a same depth D1, to have angled sidewalls with a same angle θ1, to have a same first width W1 and to have a same second width W2. In an embodiment, the pitch P1 may be between about 1 μm and about 2 μm, the depth D1 may be between about 1500 Å and about 3000 Å, such as about 2000 Å, the angle θ1 of the sidewalls may be between about 60° and about 70°, such as about 60.46°, the first width W1 may be between about 0.38 μm and about 0.5 μm, and the second width W2 may be between about 0.02 μm and about 0.33 μm such as about 0.5 μm. However, any suitable pitch P1, any suitable depth D1, any suitable angle θ1, and any suitable widths W1 and W2 may be utilized for the recesses 121 of the base dielectric layer 119. Although examples are provided of the recesses 121 of the series having the same characteristics such as pitches P1, depths D1, angles θ1, first widths W1 and second widths W2, the recesses 121 of the series may also have different values for any of these characteristics.

Figure 2:
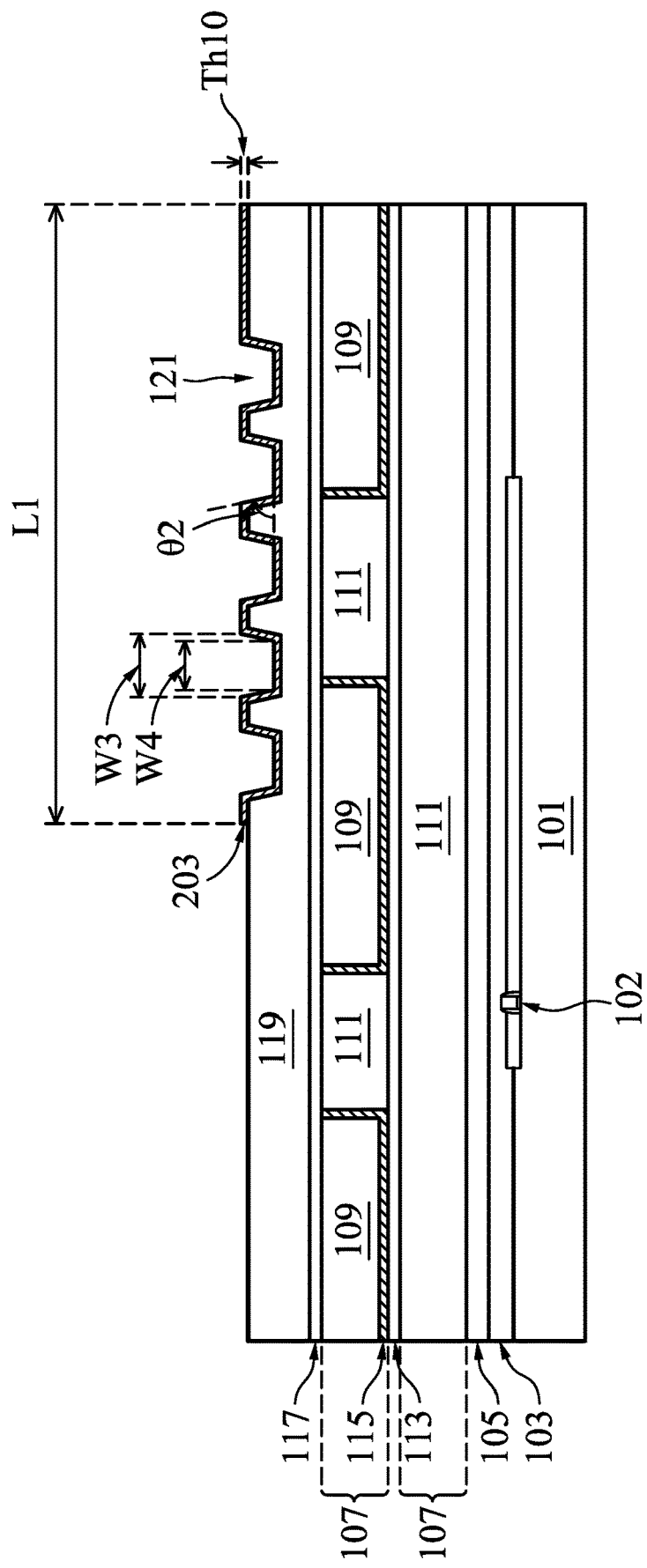

Referring to FIG. 2, a bottom electrode layer 203 is initially formed as a blanket metal layer over the base dielectric layer 119 such that the blanket metal layer conforms to the planar surfaces of the base dielectric layer 119 and conforms to the corrugated surfaces of the base dielectric layer 119 including the sidewalls and bottom surfaces of the recesses 121. As such, the bottom electrode layer 203 is formed to comprise planar regions disposed over the planar surfaces of the base dielectric layer 119 and is formed to comprise corrugated regions disposed over the corrugated surfaces of the base dielectric layer 119.

In accordance with some embodiments, the bottom electrode layer 203 is deposited by a technique including one of a chemical vapor deposition (CVD) and an atomic layer deposition (ALD). However, any suitable technique may be used to form the bottom electrode layer 203. According to some embodiments, the bottom electrode layer 203 is formed of a metal nitride such as titanium nitride (TiN), and is formed to a thickness Th10 of between about 400 Å and about 600 Å. However, any suitable material and any suitable thickness may be used to form the bottom electrode layer 203.

According to an embodiment, the recesses 121 of the corrugated portion of the bottom electrode layer 203 are formed to have angled sidewalls with a same angle θ2, are formed to have a same first width W3 and are formed to have a same second width W4. In an embodiment, the angle θ2 of the sidewalls may be between about 60° and about 70°, such as about 60.46°, the first width W3 may be between about 0.26 µm and about 0.38 µm, and the second width W4 may be between about 0 µm and about 0.14 µm. However, any suitable angle θ2, and any suitable widths W3 and W4 may be utilized for the recesses 121 of the corrugated portion of the bottom electrode layer 203.

In some embodiments, an etching process may follow the formation of the blanket metal layer to remove an undesired portion of the bottom electrode layer 203. For example, a photo resist layer may be deposited as a blanket layer over the blanket metal layer. Once deposited, the photo resist layer may be patterned to expose a portion of the blanket metal layer (e.g., in the planar region 125 of the base dielectric layer 119) to be removed. The exposed portion of the blanket metal layer is removed by a suitable etching process (e.g., a wet or dry etch using, in some embodiments, a second process gas comprising hydrofluoric acid (HF)). However, any suitable etching process may be used and any suitable etchant may be used to remove undesired portions of the of the bottom electrode layer 203. Depending on the etching process used to remove the exposed portion of the blanket metal layer, all, some or none of the photo resist layer may be consumed during etching. Any remaining material of the photo resist layer may be removed from the remaining portion of the bottom electrode layer 203, for example, by an ashing process. However, any suitable process may be used to remove the remaining material of the photo resist layer.

In some embodiments, the bottom electrode layer 203 may be etched to have an overall length L1 of between about 10 µm and about 250 µm. However, any suitable length may be used for the bottom electrode layer 203.

Figure 3:
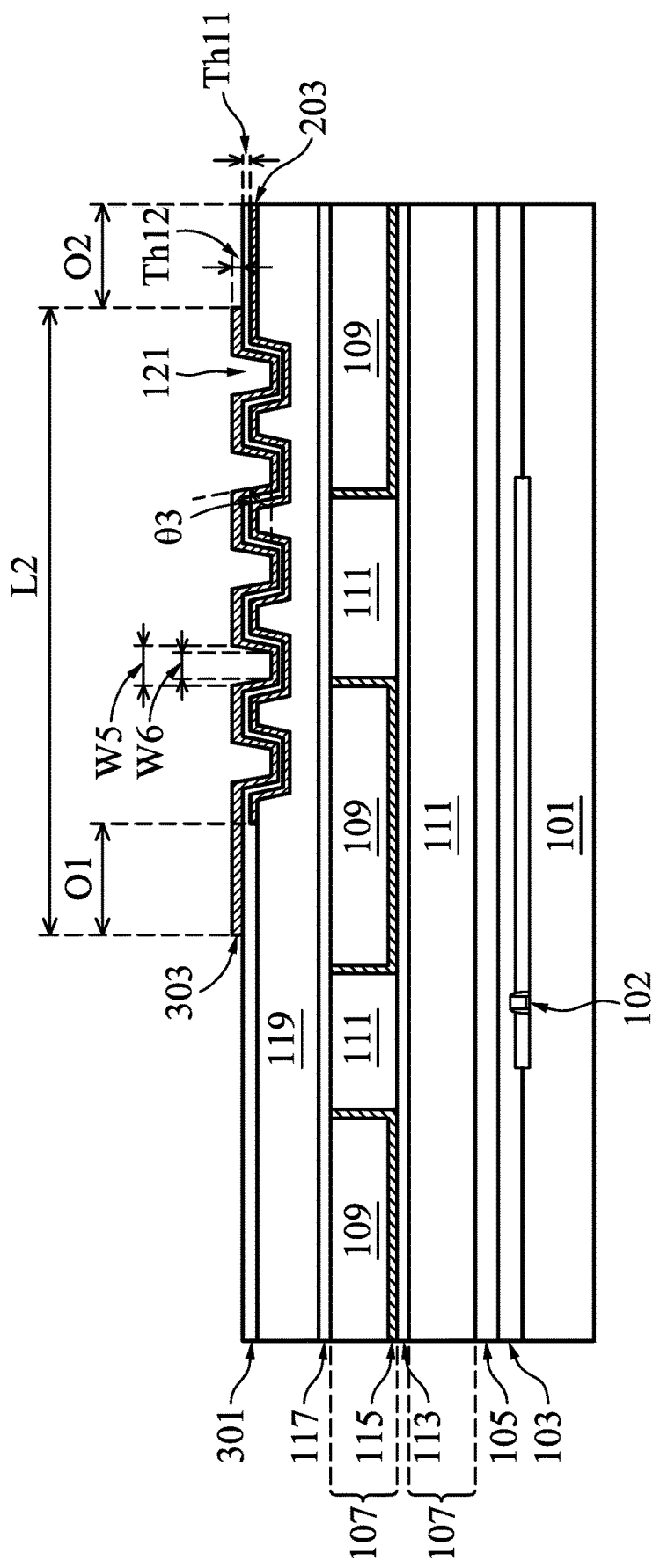

Referring to FIG. 3, this figure illustrates the deposition of a first capacitor insulator layer 301 over the bottom electrode layer 203. The first capacitor insulator layer 301 may be deposited as a high-K dielectric layer via one or more deposition processes, such as, atomic layer deposition (ALD), chemical vapor deposition (CVD), physical vapor deposition (PVD), combinations thereof, and the like. The first capacitor insulating layer 301 is formed as a blanket insulating layer (e.g., dielectric film layer) over the bottom electrode layer 203 such that the blanket insulating layer conforms to the planar surfaces of the base dielectric layer 119 and conforms to the corrugated surfaces of the bottom electrode layer 203 including the sidewalls and bottom surfaces of the recesses 121 of the bottom electrode layer 203. As such, the first capacitor insulating layer 301 is formed to comprise planar regions disposed over the planar surfaces of the base dielectric layer 119 and is formed to comprise corrugated regions disposed over the corrugated surfaces of the bottom electrode layer 203.

In some embodiments, the first capacitor insulator layer 301 is formed as a composite layer of stacked dielectric layers. For example, the first capacitor insulator layer 301 may be formed as a layered stack of $ZrO_2/Al_2O_3/ZrO_2$ (ZAZ), which includes a first zirconium oxide ($ZrO_2$) layer, an aluminum oxide ($Al_2O_3$) layer over the first $ZrO_2$ layer, and a second $ZrO_2$ layer over the $Al_2O_3$ layer. ZAZ has the advantageous feature of having a low equivalent oxide thickness, and hence the capacitance value of the resulting capacitor is high. In accordance with other embodiments of the present disclosure, the first capacitor insulator layer 301 is formed as a single layer of a homogenous dielectric material such as zirconium oxide ($ZrO_2$). Furthermore, the first capacitor insulator layer 301 may be formed to a thickness Th11 of between about 400 Å and about 3000 Å, such as about 2000 Å.

FIG. 3 further illustrates the formation of a middle electrode layer 303 over the first capacitor insulator layer 301. The middle electrode layer 303 may be deposited as a blanket metal layer over the first capacitor insulator layer 301 using a deposition process described above with regard to the bottom electrode layer 203. The middle electrode layer 303 may be deposited using a same deposition process as used to form the bottom electrode layer 203 or may be deposited using a different deposition process. As such, the middle electrode layer 303 is formed to comprise planar regions disposed over the planar surfaces of the first capacitor insulator layer 301 and is formed to comprise corrugated regions disposed over the corrugated surfaces of the first capacitor insulator layer 301. The middle electrode layer 303 may be formed of a same material as the bottom electrode layer 203 (e.g., titanium nitride (TiN)) or may be formed of a different material as the bottom electrode layer 203. In some embodiments, the middle electrode layer 303 may be formed to a thickness Th12 of between about 400 Å and about 600 Å. However, any suitable material and any suitable thickness may be used for the middle electrode layer 303.

Once deposited, the blanket metal layer of the middle electrode layer 303 may be etched to remove one or more portions of the blanket metal layer over the first capacitor insulator layer 301 using an etching process described above with regard to the bottom electrode layer 203. The middle electrode layer 303 may be etched using a same etching technique as used to etch the bottom electrode layer 203 or may be etched using a different etching technique. In some embodiments, the middle electrode layer 303 may be etched to have an overall length L2 of between about 10 µm and about 250 µm. However, any suitable length may be used for the middle electrode layer 303.

Furthermore, the middle electrode layer 303 may be etched such that a first end of the middle electrode layer 303 is offset from a first end of the bottom electrode layer 203 by a first offset O1, according to some embodiments. The middle electrode layer 303 may be etched such that a second end of the middle electrode layer 303 is offset from a second end of the bottom electrode layer 203 by a second offset O2. According to some embodiments, the first end of the middle electrode layer 303 overlies a first conductive line of the plurality of conductive lines 109 and the second end of the bottom electrode layer 203 overlies a second conductive line of the plurality of conductive lines 109. In some embodiments, the first offset O1 may be between about 0.1 µm and about 0.2 µm and the second offset O2 may be between about 0.1 µm and about 0.2 µm. However, any offset may be used for the first offset O1 and for the second offset O2 of the middle electrode layer 303.

According to an embodiment, the recesses 121 of the corrugated portion of the middle electrode layer 303 are formed to have angled sidewalls with a same angle θ3, to have a same first width W5 and to have a same second width W6. In an embodiment, the angle θ3 of the sidewalls of the middle electrode layer 303 may be between about 60° and about 70°, such as about 60.46°, the first width W5 of the middle electrode layer 303 may be between about 0.14 μm and about 0.26 μm, and the second width W6 of the middle electrode layer 303 may be between about 0 μm and about 0.02 μm. However, any suitable angle θ3, and any suitable widths W5 and W6 may be utilized for the recesses 121 of the corrugated portion of the middle electrode layer 303.

Figure 4:
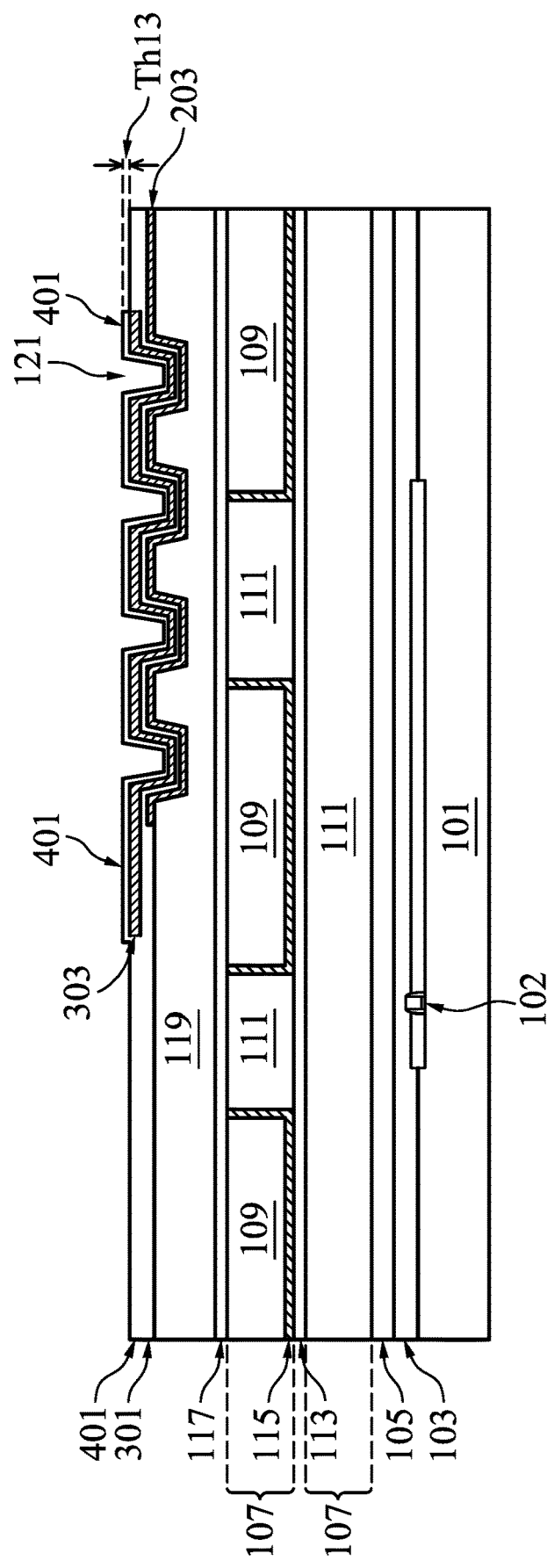

Referring to FIG. 4, this figure illustrates the deposition of a second capacitor insulator layer 401 over the middle electrode layer 303. The second capacitor insulator layer 401 may be deposited as a high-K dielectric layer using one or more deposition processes as discussed above with regard to the first capacitor insulator layer 301. As such, the second capacitor insulator layer 401 is formed to comprise planar regions disposed over the planar surfaces of the first insulator layer 301 and is formed to comprise corrugated regions disposed over the corrugated surfaces of the middle electrode layer 303. The second capacitor insulator layer 401 may be deposited using the same materials and same processes used to deposit the first capacitor insulator layer 301. However, the materials and processes used to deposit the second capacitor insulating layer 401 may be different from the materials and processes used to deposit the first capacitor insulating material 301.

In some embodiments, the second capacitor insulator layer 401 is formed as a composite layer of stacked dielectric layers (e.g., ZAZ). In accordance with other embodiments of the present disclosure, the second capacitor insulator layer 401 is formed as a single layer of a homogenous dielectric material (e.g., $ZrO_2$). Furthermore, the second capacitor insulator layer 401 may be formed to a thickness Th13 of between about 60 Å and about 80 Å.

Figure 5A:
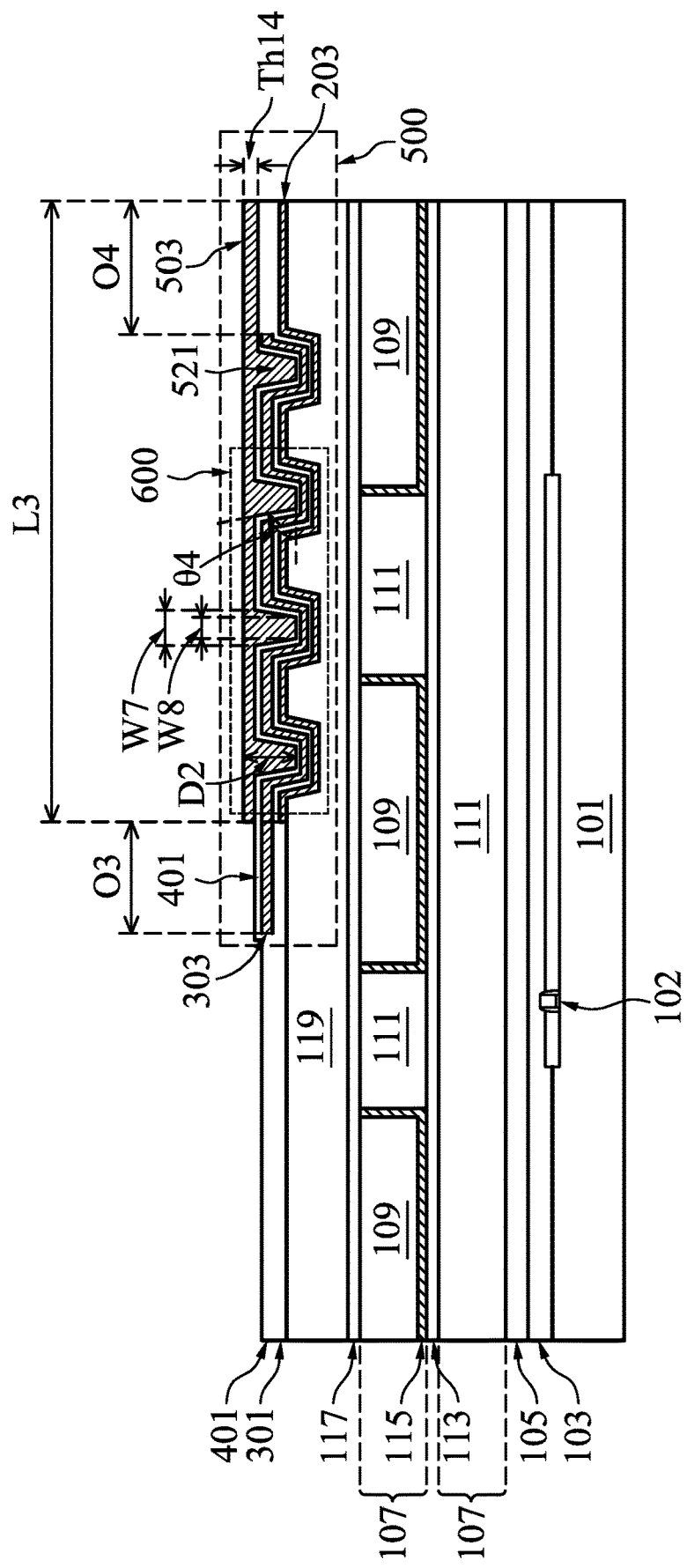

FIG. 5A illustrates the formation of a top electrode layer 503 over the second capacitor insulator layer 401. The top electrode layer 503 may be deposited as a blanket metal layer over the second capacitor insulator layer 401 using a deposition process described above with regard to the bottom electrode layer 203 and with regard to the middle electrode layer 303. The top electrode layer 503 may be deposited using a same deposition process as used to form either of the bottom electrode layer 203 and the middle electrode layer 303 or may be deposited using a different deposition process. As such, the top electrode layer 503 is formed to comprise planar regions disposed over the planar surfaces of the second capacitor insulator layer 401 and is formed to comprise corrugated regions disposed over the corrugated surfaces of the second capacitor insulator layer 401. The top electrode layer 503 may be formed of a same material as either of the bottom electrode layer 203 and the middle electrode layer 303 (e.g., titanium nitride (TiN)) or may be formed of a different material. However, any suitable material may be used for the top electrode layer 503.

According to some embodiments, a conductive fill material may be used to form the top electrode layer 503. As such, the conductive fill material may be deposited over the second capacitor insulating layer 401 to fill the recesses 121 in the corrugated portion of the second capacitor insulating layer 401, thereby forming plug portions 521 of the top electrode layer 503, as illustrated in FIG. 5A. The conductive fill material used to form the top electrode layer 503 may be a same material as either of the bottom electrode layer 203 and the middle electrode layer 303 (e.g., titanium nitride (TiN)) or may be formed of a different material. However, any suitable material may be used for the conductive fill material of the top electrode layer 503.

The conductive fill material may be overfilled to a level above the planar surfaces of the second capacitor insulating layer 401. Once deposited, a planarization process (e.g., CMP) may be performed to remove excess portions of the conductive fill material from the surface of the top electrode layer 503. As such, a planar surface of the top electrode layer 503 may be reduced to a thickness Th14 and may be reduced to a second depth D2 in the plug portions 521. In some embodiments, the thickness Th14 of the planar region of the top electrode layer 503 may be between about 400 Å and about 800 Å and the second depth D2 in the plug portions 521 may be between about 1500 Å and about 3000 Å, such as about 2000 Å, as illustrated in FIG. 5A. However, any suitable material, any suitable thickness, and any suitable depth may be used for the top electrode layer 503.

Once deposited, the blanket metal layer of the top electrode layer 503 may be etched to remove one or more portions of the blanket metal layer over the second capacitor insulator layer 401 using an etching process described above with regard to the bottom electrode layer 203 and the middle electrode layer 303. The top electrode layer 503 may be etched using a same etching technique as used to etch either of the bottom electrode layer 203 and the middle electrode layer 303 or may be etched using a different etching technique. In some embodiments, the top electrode layer 503 may be etched to have an overall length L3 of between about 10 μm and about 250 μm. However, any suitable length may be used for the top electrode layer 503.

Furthermore, the top electrode layer 503 may be etched such that a first end of the top electrode layer 503 is offset from the first end of the middle electrode layer 303 by a third offset O3, according to some embodiments. The top electrode layer 503 may be etched such that a second end of the top electrode layer 503 is offset from the second end of the middle electrode layer 303 by a fourth offset O4. According to some embodiments, the first end of the middle electrode layer 303 overlies the first conductive line of the plurality of conductive lines 109 and the second end of the top electrode layer 503 overlies the second conductive line of the plurality of conductive lines 109. In some embodiments, the third offset O3 may be between about 0.1 μm and about 0.2 μm and the fourth offset O4 may be between about 0.1 μm and about 0.2 μm. However, any offset may be used for the third offset O3 and for the fourth offset O4 of the top electrode layer 503.

According to an embodiment, the plug portions 521 of the top electrode layer 503 filling the recesses 121 of the corrugated portion of the second capacitor insulating layer 401 are formed to have angled sidewalls with a same angle θ4, to have a same first width W7 and to have a same second width W8. In an embodiment, the angle θ4 of the sidewalls of the plug portions 521 may be between about 60° and about 70°, such as about 60.46°, the first width W5 of the middle electrode layer 303 may be between about 0.14 μm and about 0.26 nm, such as about 0.5 μm and the second width W6 of the middle electrode layer 303 may be between about 0 μm and about 0.5 μm, such as about 0.02 μm. However, any suitable angle θ4, and any suitable widths W7 and W8 may be utilized for the plug portions 521 of the top electrode layer 503. The plug portions 521 of the top electrode layer 503 having a greater amount of conductive material, as compared to a planar electrode layer, provide for lower resistance and thus provide for improved chip speed and for still greater capacitance of the 3D-MIM-SHD capacitor 500.

As shown in FIG. 5A, the bottom electrode layer 203, the middle electrode layer 303 and the top electrode layer 503 are arranged in a stack with the first capacitor insulating layer 301 and the second capacitor insulating layer 401 separating the middle electrode layer 303 from each of the bottom electrode layer 203 and the top electrode layer 503. The stacked arrangement of electrode layers separated by insulating layers forms a metal-insulator-metal super high density (3D-MIM-SHD) capacitor 500 (e.g., a 3D three plate capacitor) over the first and second conductive lines of the plurality of conductive lines 109. The angled sidewalls of the stacked arrangement of electrode layers separated by insulating layers having angles of between about 60° and about 70°, such as about 60.46° provides for a BPC titanium nitride (TiN) profile taper. The BPC taper leads to improved MPC/TPC corner effect performance as compared to a non-tapered profile.

Figure 5B:
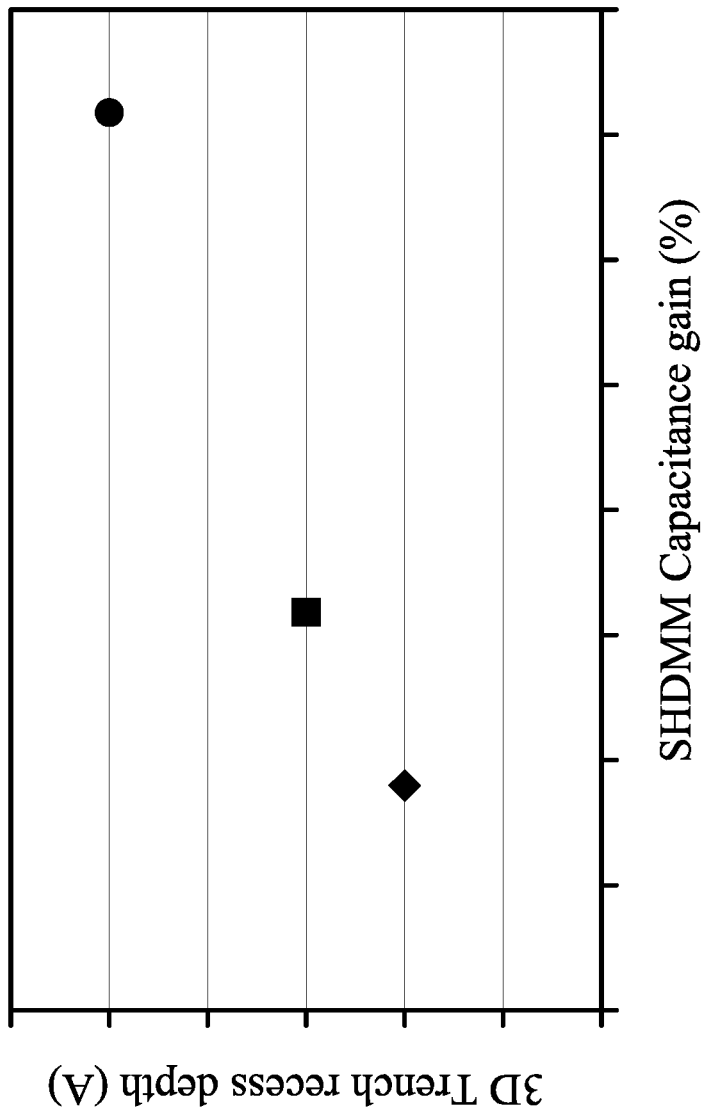
FIG. 5B is a graph that illustrates a correlation between a capacitance gain and a 3D-trench recess depth of the 3D-MIM-SHD capacitor 500.

FIG. 5B is a graph that illustrates a correlation between a capacitance gain and a 3D-trench recess depth of the 3D-MIM-SHD capacitor 500. The corrugated profile of the electrode layers (203, 303, 503) (e.g., corrugated metal plates) separated by the capacitor insulating layers (301, 401) provide for a greater surface area of the 3D-MIM-SHD capacitor 500 with a smaller footprint. Based on the dimensions of the 3D-MIM-SHD capacitor 500 including a 3D-trench recess depth, a capacitance gain of between about 10% and about 36% may be realized as compared to a 3-plate capacitor of the same dimensions with planar electrodes. As such, the capacitance gain of the 3D-MIM-SHD capacitor 500 may be correlated with the 3D-trench recess depth.

For example, a 3D-MIM-SHD with a 3D-trench structure with trench widths of 0.5 µm and spacing between trenches of 0.5 µm (i.e., trench pitch of 1 µm) and having a footprint (e.g., area of overall width×length) of 250 µm×250 µm and a 3D-trench recess depth of 1500 Å would provide about 9% greater area gain (e.g., from 62,500 µm² to 68,125 µm²) and capacitance as compared to a 3-plate planar electrode capacitor with the same footprint of 250 µm×250 µm. As another example, a 3D-MIM-SHD with the same 3D-trench structure and having the same footprint of 250 µm×250 µm and a 3D-trench recess depth, however, of 2000 Å would provide about 16% greater area gain (e.g., from 62,500 µm² to 72,500 µm²) and capacitance as compared to a 3-plate planar electrode capacitor with the same footprint. As still another example, a 3D-MIM-SHD with the same 3D-trench structure and having the same footprint of 250 µm×250 µm and a 3D-trench recess depth, however, of 3000 Å would provide about 36% greater area gain (e.g., from 62,500 µm² to 85,000 µm²) and capacitance as compared to a 3-plate planar electrode capacitor with the same footprint. Therefore, the 3D-MIM-SHD capacitor may be used in high-performance computing applications with greater performance while maintaining a small footprint.

FIG. 5A further illustrates a section 600 of the 3D-MIM-SHD capacitor is highlighted with a dashed outline. Section 600 will be discussed in greater detail below with regard to the following figures.

Figure 6A:
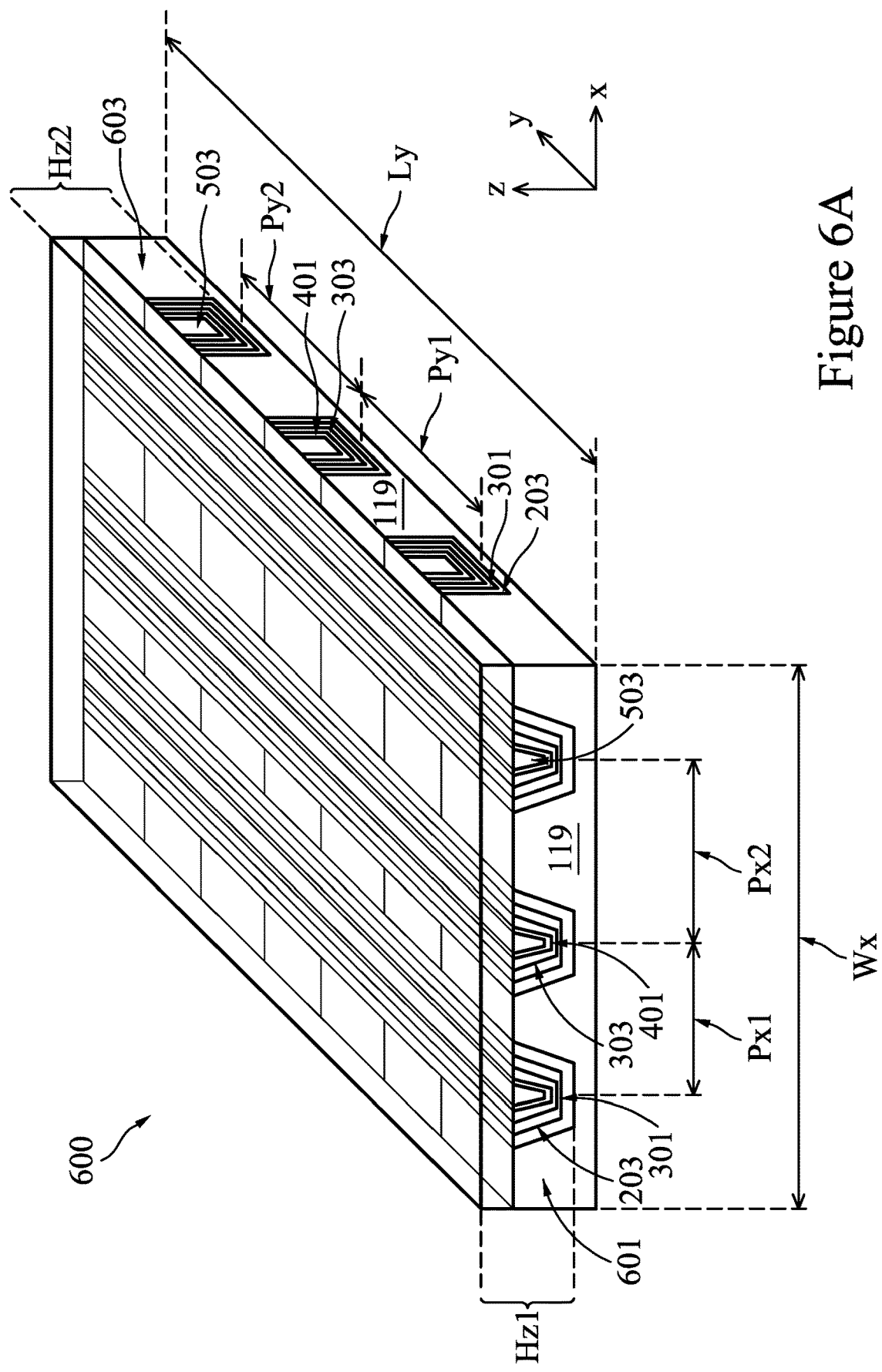
FIG. 6A illustrates a perspective view of a section of the capacitor formed within the device die of the intermediate stage shown in FIG. 5A, in accordance with some embodiments.

Referring to FIG. 6A, this figure illustrates a perspective view of the section 600 of the 3D-MIM-SHD capacitor 500. In particular, FIG. 6A illustrates the section 600 including the stacked arrangement of electrode layers (203, 303, 503) separated by insulating layers (301, 401) formed within a first series of trenches 601 of the base dielectric layer 119 and formed within a second series of trenches 603 of the base dielectric layer 119. The first series of trenches 601 are distributed in a direction of an x-axis and are formed with centerlines extending in a direction of a y-axis. The second series of trenches 603 are distributed in a direction of the y-axis and are formed with centerlines extending in a direction of the x-axis. As such, the stacked arrangement of electrode layers (203, 303, 503) separated by insulating layers (301, 401) formed within the first series of trenches 601 and formed within the second series of trenches 603 form a grating type trench structure within the base dielectric layer 119.

Although FIG. 6A illustrates the first series of trenches 601 including three trenches and the second series of trenches 603 including three trenches, it is to be understood that the first series of trenches 601 and the second series of trenches 603 may include any suitable number of trenches. In some embodiments, the number of trenches in the first series of trenches 601 may be the same as the number of trenches in the second series of trenches 603. However, in other embodiments, the number of trenches in the second series of trenches 603 may be different from the number of trenches in the first series of trenches 601. For example, in an embodiment, the capacitor 500 illustrated in FIG. 5A may be formed such that the first series of trenches 601 include four trenches and the second series of trenches 603 include three trenches. According to some embodiments, the capacitor 500 may be formed such that the first series of trenches 601 include between about 3 trenches and about 4 trenches, such as about 4 trenches and may be formed such that the second series of trenches 603 include between about 3 trenches and about 4 trenches, such as about 4 trenches. However, any suitable number of trenches may be formed in the first series of trenches 601 and any suitable number of trenches may be formed in the second series of trenches 603.

In some embodiments, the stacked arrangement of electrode layers is formed within the first series of trenches 601 to have a first height Hz1 extending in a direction of a z-axis of between about 1500 Å and about 3000 Å, such as about 2000 Å. However, any suitable height may be used for the first height Hz1. In some embodiments, the stacked arrangement of electrode layers is formed within the first series of tranches 601 to have a first pitch Px1 between centerlines of some adjacent trenches of the first series 601 and to have a second pitch Px2 between centerlines of other adjacent trenches of the first series 601. In some embodiments, the second pitch Px2 between centerlines of other adjacent trenches of the first series 601 may be different from the first pitch Px1 between centerlines of some adjacent trenches of the first series 601; however, in other embodiments, the pitch between all adjacent trenches of the first series 601 may be the same (e.g., Px1). In some embodiments, the first pitch Px1 between centerlines of some adjacent trenches of the first series 601 is between about 1 µm and about 2 µm and the second pitch Px2 between centerlines of other adjacent trenches of the first series 601 is between about 1 µm and about 2 µm. However, any suitable pitches may be used for the first pitch Px1 between centerlines of some adjacent trenches of the first series 601 and for the second pitch Px2 between centerlines of other adjacent trenches of the first series 601.

In some embodiments, the stacked arrangement of electrode layers is formed within the second series of trenches 603 to have a second height Hz2 extending in a direction of the z-axis of between about 1500 Å and about 3000 Å, such as about 2000 Å. However, any suitable height may be used for the second height Hz2. In some embodiments, the second height Hz2 may be different from the first height Hz1; however, in other embodiments the second height Hz2 may be equal to the first height Hz1.

According to some embodiments, the stacked arrangement of electrode layers is formed within the second series of trenches 603 to have a first pitch Py1 between centerlines of some adjacent trenches of the second series 603 and to have a second pitch Py2 between centerlines of other adjacent trenches of the second series 603. In some embodiments, the second pitch Py2 between centerlines of other adjacent trenches of the second series 603 may be different from the first pitch Py1 between centerlines of some adjacent trenches of the second series 603; however, in other embodiments, the pitch between all adjacent trenches of the second series may be the same (e.g., Py1). In some embodiments, the first pitch Py1 between centerlines of some adjacent trenches of the second series 603 is between about 1 µm and about 2 µm and the second pitch Py2 between centerlines of other adjacent trenches of the second series 603 is between about 1 µm and about 2 µm. However, any suitable pitches may be used for the first pitch Py1 between centerlines of some adjacent trenches of the second series 603 and for the second pitch Py2 between centerlines of other adjacent trenches of the second series 603.

FIG. 6A further illustrates the section 600 of the 3D-MIM-SHD capacitor highlighted in FIG. 5A formed to a width Wx extending in a direction of the x-axis and formed to a length Ly extending in a direction of the y-axis. According to some embodiments, the 3D-MIM-SHD capacitor 500 structure, illustrated in FIG. 5A, may be formed to an overall width Wx extending in a direction of the x-axis of between about 10 µm and about 250 µm and may be formed to an overall length Ly extending in a direction of the y-axis of between about 10 µm and about 250 µm.

Figure 6B:
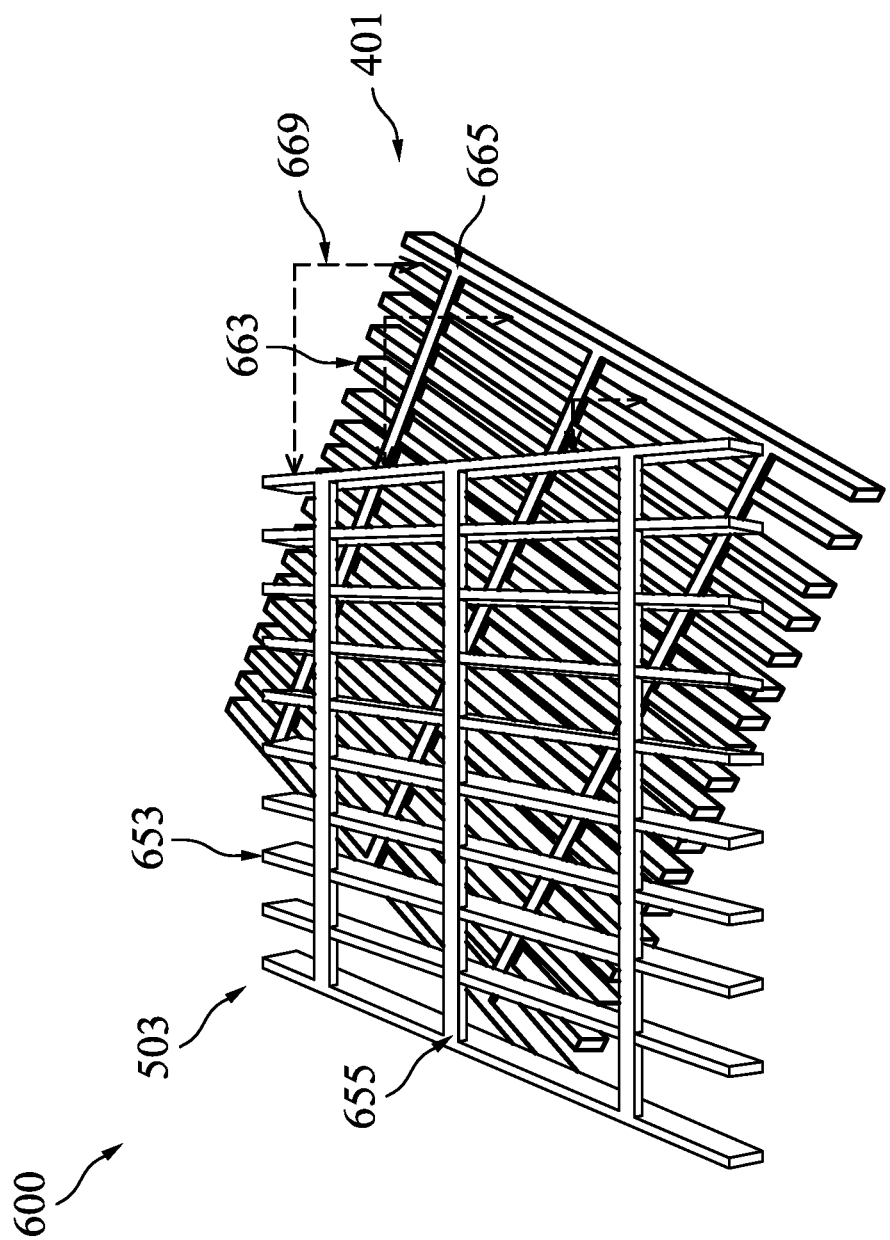
FIG. 6B illustrates, in an exploded view, a representation of a top electrode layer 503 disposed over and nested within contours of the second capacitor insulator layer 401 of the capacitor formed within the device die of the intermediate stage shown in FIG. 5A, in accordance with some embodiments.

FIG. 6B illustrates, in an exploded view, the top electrode layer 503 disposed over the second capacitor insulator layer 401 of the section 600 of the 3D-MIM-SHD capacitor structure illustrated in FIG. 5A in accordance with some embodiments. The corrugated profile of the top electrode layer 503 is illustrated in FIG. 6B as a plurality of conductive members 653 integrally formed with a plurality of conductive cross members 655, according to some embodiments. The corrugated profile of the second capacitor insulator layer 401 is illustrated in FIG. 6B as a plurality of insulating members 663 integrally formed with a plurality of insulating cross members 665. FIG. 6B further illustrates directional arrows 669 indicating portions of the conductive members 653 of the top electrode layer 503 that nest within recesses of adjacent members of the plurality of insulating members 663 of the second capacitor insulating layer 401, when the top electrode layer 503 is deposited over the second capacitor insulator layer 401, according to some embodiments.

Figure 7:
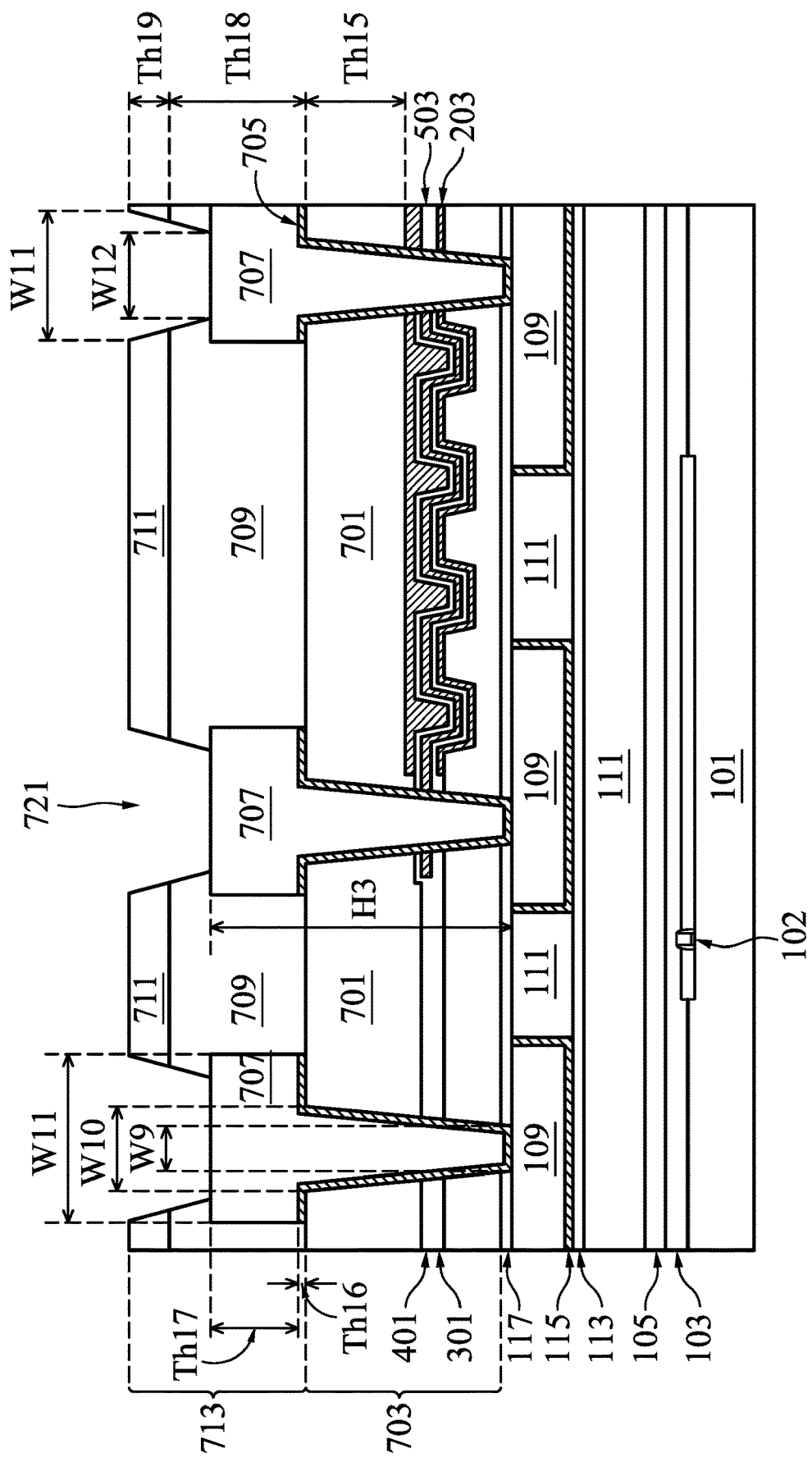
FIG. 7 illustrates a cross-sectional view of an intermediate stage in the formation of contact plugs through the capacitor formed within the semiconductor die of the intermediate stage shown in FIG. 5A, in accordance with some embodiments.

Turning to FIG. 7, this figure illustrates the formation of an integrated contact layer 713 over the 3D-MIM-SHD capacitor 500 of FIG. 5A. FIG. 7 illustrates the formation of contact plugs of the integrated contact layer 713 connected to the 3D-MIM-SHD capacitor 500 and to the first and second conductive lines of the plurality of conductive lines 109 of the top metallization layer 107, according to some embodiments.

A cap dielectric layer 701 is formed over the 3D-MIM-SHD capacitor 500 and exposed upper surfaces of the second capacitor insulating layer 401. According to some embodiments, the cap dielectric layer 701 is formed over the 3D-MIM-SHD capacitor 500 as a plasma enhanced oxide undoped silicon glass (PEOX-USG) to a thickness Th15 of between about 5,500 Å and about 8,500 Å, such as about 6,500 Å. The cap dielectric layer 701 may be formed as a blanket layer over the 3D-MIM-SHD capacitor 500 and exposed upper surfaces of the second capacitor insulating layer 401 using Plasma Enhance Chemical Vapor Deposition (PECVD), Low-Pressure Chemical Vapor Deposition (LPCVD), Atomic Layer Deposition (ALD), or the like. However, any suitable material, any suitable thickness and any suitable method may be utilized to form the cap dielectric layer 701. As such, the base dielectric layer 119, the 3D-MIM-SHD capacitor 500, the first capacitor insulating layer 301, the second capacitor insulating layer 401 and the cap dielectric layer 701 collectively form an integrated device layer 703.

FIG. 7 further illustrates the formation of a contact layer 713 over the integrated device layer 703. According to an embodiment, one or more photo lithography processes (e.g., damascene or dual damascene process) are performed in order to create a via opening through the device layer 703 and the hard mask layer 117 in order to expose a contact area of an upper surface of a conductive line of the plurality of conductive lines 109 in the top metallization layer 107. However, any number and any suitable lithography processes may be used to form the via openings.

According to an embodiment, a first via opening is formed through the device layer 703 and the hard mask layer 117 to expose a contact area at a surface of the first conductive line of the plurality of conductive lines 109. The first via opening is formed through the device layer 703 such that the first via opening is formed through the second capacitor insulating layer 401, through the middle electrode layer 303 and through the first capacitor insulating layer 301.

According to an embodiment, a second via opening is formed through the device layer 703 and the hard mask layer 117 to expose a contact area at a surface of the second conductive line of the plurality of conductive lines 109. The second via opening is formed through the device layer 703 such that the second via opening is formed through the top electrode layer 503, through the second capacitor insulating layer 401, through the first capacitor insulating layer 301, and through the bottom electrode layer 203.

According to an embodiment, a third via opening is formed through the device layer 703 and the hard mask layer 117 to expose a contact area at a surface of a third conductive line of the plurality of conductive lines 109. The third via opening is formed through the device layer 703 such that the third via opening is formed through the second capacitor insulating layer 401 and through the first capacitor insulating layer 301 but is not formed through a conductive layer of the 3D-MIM-SHD capacitor 500.

Once the plurality of via openings have been formed, a plug diffusion barrier layer 705 is formed over the device layer 703 conforming to the planar surfaces of the cap dielectric layer 701 and conforming to the sidewalls of the via openings and conforming to the exposed contact areas of the one or more conductive lines of the plurality of conductive lines 109. In some embodiments, the plug diffusion barrier layer 705 is formed of one or more layers of conductive materials, such as titanium (Ti), titanium nitride (TiN), tantalum (Ta), tantalum nitride (TaN), or the like. In some embodiments, the plug diffusion barrier layer 705 is formed of a thin layer of tantalum nitride (TaN) deposited by chemical vapor deposition techniques. According to some embodiments, the plug diffusion barrier layer 705 may be formed to a thickness Th16 of between about 600 Å and about 800 Å. However, any suitable material, any suitable deposition method and any suitable thickness may be used for the plug diffusion barrier layer 705.

Once the plurality of via openings has been formed, a photoresist is applied over the plug diffusion barrier layer 705. After the photoresist has been applied, the photoresist may be patterned and developed to form openings in a shape for the upper portion of the contact plugs.

Once patterned, a conductive layer is formed in the via openings over the plug diffusion barrier layer 705. The remaining portions of the via openings may be filled with a conductive fill material by, for example, performing a deposition process to a thickness such that the conductive fill material fills the remaining portions of the via openings and overfills the via openings such that a conductive layer of the conductive fill material reaches a level above an upper surface of the plug diffusion barrier layer 705. The conductive fill material comprises metals, elemental metals, transitional metals, or the like. In some embodiments, the conductive fill material comprises one or more of copper, aluminum, tungsten, cobalt, or alloys thereof (e.g., an aluminum copper alloy (AlCu)). The conductive fill material may be formed using a selective plating technique such as electro-less plating. Furthermore, the conductive fill material may be formed by depositing a seed layer and performing an electro-chemical plating process. However, any suitable material and any suitable technique may be used for the conductive fill material.

Once deposited, the conductive fill material may be subjected to a planarization process, such as a chemical-mechanical polishing (CMP) to planarize the surface and to remove excess deposits of the conductive fill material used to form the conductive layer. In an embodiment, the surface of the conductive layer of the conductive fill material may be reduced such that a thickness Th17 of the overfill portion is between about 27,000 Å and about 28,000 Å. However, any suitable planarization technique and any suitable thickness may be used for the conductive fill material.

Once planarized, the photoresist may be removed and an etching process may be performed to remove undesired portions of the plug diffusion barrier layer 705 still by the conductive fill material. Thus, conductive plugs 707 are formed with top portions extending above the surface of the cap dielectric layer 701 and bottom portions formed within the via openings, extending through the device layer 703 and electrically coupling to the one or more conductive lines 109. As such, the conductive plugs 707 form contacts of electrodes of the 3D-MIM-SHD capacitor 500.

According to some embodiments, the conductive plugs 707 may be formed to a first width W9, at the interface between plug diffusion barrier layer 705 and the contact area at the surface of the conductive lines 109; formed to a second width W10 at the upper surface of the cap dielectric layer 701; and top portions of the conductive plugs 707 formed to a third width W11 at the planarized surface of the conductive fill material. In some embodiments, the first width W9 of the conductive plugs 707 may be between about 2.7 µm and about 3.5 µm; the second width W10 of the conductive plugs 707 may be between about 2.9 µm and about 3.7 µm; and the third width W11 of the conductive plugs 707 may be between about 3.5 µm and about 3.7 µm. However, any suitable widths may be used for the first, second and third widths (W9, W10, W11) of the conductive plugs 707. Furthermore, according to some embodiments, the conductive plugs 707 may be formed to an overall height H3 of between about 36,000 Å and about 39,500 Å. However, any suitable height may be used for the overall height H3 of the conductive plugs 707.

As illustrated in FIG. 7, a first passivation layer 709 may be deposited over the conductive plugs 707, once the conductive plugs 707 have been formed to electrically connect to the contact areas at the surfaces of the conductive lines 109. The first passivation layer 709 may be deposited as a blanket layer over the top portions of the conductive plugs 707 and over exposed portions of the cap dielectric layer 701 and filling the spaces between the top portions of the conductive plugs 707.

According to some embodiments, the first passivation layer 709 is formed over the conductive plugs 707 as a plasma enhanced oxide undoped silicon glass (PEOX-USG) to a thickness Th18 of between about 12,000 Å and about 13,000 Å. The first passivation layer 709 may be formed as a blanket layer using Plasma Enhance Chemical Vapor Deposition (PECVD), Low-Pressure Chemical Vapor Deposition (LPCVD), Atomic Layer Deposition (ALD), or the like and followed by a planarization process (e.g., CMP) to planarize the surface of the first passivation layer 709. However, any suitable material, any suitable thickness and any suitable method may be utilized to form and planarize the first passivation layer 709.

FIG. 7 further illustrates a second passivation layer 711 deposited over the first passivation layer 709. The second passivation layer 711 may be formed as a blanket layer of dielectric material over the first passivation layer 709, thereby isolating the conductive plugs 707 from any subsequently formed layer. The second passivation layer 711 may be deposited using plasma enhance chemical vapor deposition (PECVD), low-pressure chemical vapor deposition (LPCVD), atomic layer deposition (ALD), or the like and once deposited, the second passivation layer 711 may be subjected to a planarization process (e.g., CMP). However, any suitable material, any suitable thickness and any suitable method may be utilized to form and planarize the second passivation layer 711. In accordance with some embodiments, the second passivation layer 711 is formed as a dielectric layer of silicon nitride (SiN) to a thickness Th19 of between about 7,000 Å and about 8,000 Å. However, any suitable material and any suitable thickness may be used for the hard mask layer 117 second passivation layer 711.

After the second passivation layer 711 has been formed, contact openings 721 may be formed through the second passivation layer 711 and into the first passivation layer 709 to expose contact areas on surfaces of the top portions of the conductive plugs 707. The contact openings 721 may be formed using any suitable photolithographic mask and etching process. For example, the first passivation layer 709 and the second passivation layer 711 may be patterned using any suitable lithographic process. In an embodiment, a photo resist layer may be deposited as a blanket layer over the second passivation layer 711 and patterned to expose areas of the second passivation layer 711 over the conductive plugs 707. The exposed areas of the second passivation layer 711 are subjected to an etching process (e.g., a wet or dry etch using, in some embodiments, the third process gas comprising phosphoric acid ($H_3PO_4$) or a dry etch using the fourth process gas comprising chlorine ($Cl_2$) or compounds of chlorine) to remove material of the second passivation layer 711 until areas of the first passivation layer 709 are exposed through the contact openings 721 in the second passivation layer 711. Once the areas of the first passivation layer 709 are exposed through the contact openings 721, the exposed areas of the first passivation layer 709 are subjected to the etching process (e.g., a plasma enhanced etch using the first process gas comprising tetrafluormethane ($CF_4$)) until contact areas of the top portions of the conductive plugs 707 are exposed through the contact openings 721.

All, some or none of the photo resist layer may be consumed during the etching of the second passivation layer 711 and the first passivation layer 709 and any remaining photo resist material may be removed, e.g., by an ashing process. However, any suitable material, any suitable deposition and any suitable removal process may be utilized for the photo resist and any suitable etching process may be utilized to form the contact openings 721. As such, the conductive plugs 707, the first passivation layer 709 and the second passivation layer 711 collectively form the integrated contact layer 713.

According to an embodiment, the contact openings 721 are formed to have a first width W13 at the upper surface of the second passivation layer 711 and a second width W12 at the exposed contact area of the top portion of the conductive plugs 707. In an embodiment, the first width W13 of the contact openings 721 may be between about 48 µm and about 49 µm and the second width W12 of the contact openings 721 may be between About 45 µm and about 47 µm, such as about 46 µm. However, any suitable widths and may be utilized for the contact openings 721.

Once formed, the contact openings 721 may, for example, serve in some embodiments to allow contact areas of metal structures formed within a subsequently formed active device layer to electrically couple to one or more of the electrodes of the 3D-MIM-SHD capacitor 500 and to electrically couple to an active device of the active devices 102 of the substrate 101 via the conductive lines 109 of the top metallization layer 107. In other embodiments, the contact openings 721 may, for example, serve to allow external contacts (e.g., UBM and solder balls) to be formed over the exposed contact areas on the top portions of the conductive plugs 707.

The advanced lithography process, method, and materials described above can be used in many applications, including a 3D-trench pattern used in the fabrication of the metal-insulator-metal (MIM) capacitor, according to some embodiments described herein. For example, the 3D-trenches may be patterned to produce a relatively close spacing between features, for which the above disclosure is well suited.

In an embodiment, a method includes depositing a base layer of a first dielectric material over a semiconductor substrate; etching a series of recesses in the base layer; depositing a series of conductive layers and dielectric layers within each recess of the series of recesses to form a capacitor; forming a first contact plug through a first conductive layer of the series of conductive layers and in contact with a first conductive line located between the base layer and the semiconductor substrate; and forming a second contact plug through a second conductive layer of the series of conductive layers and through a third conductive layer of the series of conductive layers and in contact with a second conductive line located between the base layer and the semiconductor substrate. In an embodiment the depositing the series of conductive layers and dielectric layers within the series of recesses further includes: depositing a top layer of the dielectric layers; and filling a remaining space within the series of recesses over the top layer of the dielectric layers with a conductive fill such that a first side of the conductive fill facing the series of recesses conforms to a profile of the series of recesses and such that a second side of the conductive fill facing away from the series of recesses is planar. In an embodiment depositing the series of conductive layers further comprises depositing layers of titanium nitride. In an embodiment depositing the dielectric layers of the series of conductive layers and dielectric layers within the series of recesses further comprises depositing a first zirconium oxide layer, an aluminum oxide layer over the first zirconium oxide layer, and a second zirconium oxide layer over the aluminum oxide layer. In an embodiment etching the series of recesses in the base layer further comprises forming a first series of trenches in the base layer in a first direction and forming a second series of trenches in the base layer in a second direction, the second direction being different from the first direction. In an embodiment forming the first series of trenches further includes forming the first series of trenches to a first depth and wherein forming the second series of trenches further comprises forming the second series of trenches to a second depth, the second depth being different from the first depth. In an embodiment forming the second contact plug further includes: etching a contact opening through the second conductive layer and the third conductive layer; and depositing a conductive fill material over and filling the contact opening.

In an embodiment, a method includes: forming a three plate capacitor within a dielectric film layer over a plurality of conductive lines of a semiconductor device, the three plate capacitor including a series of corrugated metal plates separated by insulating layers; etching a first contact opening through the dielectric film layer and through a middle plate of the three plate capacitor to expose a contact area of a first conductive line of the plurality of conductive lines; etching a second contact opening through the dielectric film layer, through a top plate of the three plate capacitor, and through a bottom plate of the three plate capacitor to expose a contact area of a second conductive line of the plurality of conductive lines; and depositing a conductive fill material over the dielectric film layer such that the conductive fill material fills the first contact opening and physically contacts each of the middle plate and the contact area of the first conductive line and such that the conductive fill material fills the second contact opening and physically contacts each of the top plate, the bottom plate and the contact area of the second conductive line. In an embodiment the forming the three plate capacitor includes: etching a series of recesses in a dielectric substrate layer; and depositing a series of conductive layers and dielectric layers within the series of recesses. In an embodiment forming a three plate capacitor further includes depositing a top layer of the series of conductive layers to fill remaining spaces within the series of recesses. In an embodiment depositing the top layer further comprises performing a chemical mechanical planarization. In an embodiment depositing the top layer further comprises etching the top layer to offset a first end of the top layer from a first end of a middle layer of the series of conductive layers. In an embodiment forming a three plate capacitor further comprises depositing at least one layer of titanium nitride. In an embodiment depositing the dielectric layers within the series of recesses further comprises depositing a first zirconium oxide layer, an aluminum oxide layer over the first zirconium oxide layer, and a second zirconium oxide layer over the aluminum oxide layer.

In an embodiment, a semiconductor device includes a capacitor including three corrugated metal plates separated by dielectric layers over a semiconductor substrate; a first metallic via electrically coupling a middle plate of the three corrugated metal plates to a first metal conductor, the first metal conductor being located between the first metallic via and the semiconductor substrate; and a second metallic via electrically coupling a top plate and a bottom plate of the three corrugated metal plates to a second metal conductor, the second metal conductor being located between the second metallic via and the semiconductor substrate. In an embodiment the top plate comprises a corrugated profile side facing the middle plate and a planar side facing away from the middle plate. In an embodiment the corrugated metal plates comprise titanium nitride. In an embodiment the dielectric layers comprise a first zirconium oxide layer, an aluminum oxide layer over the first zirconium oxide layer, and a second zirconium oxide layer over the aluminum oxide layer. In an embodiment each of the three corrugated metal plates includes a first series of ridges arranged in a first direction and a second series of ridges arranged in a second direction, the second direction being different from the first direction. In an embodiment the first series of ridges have a first height and the second series of ridges have a second height, the second height being different from the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a base layer of a first dielectric material over a semiconductor substrate;
   etching a series of recesses in the base layer, the etching comprising simultaneously forming a first series of trenches and simultaneously forming a second series of trenches in the base layer, wherein the first series of trenches are oriented lengthwise along a first direction, wherein the second series of trenches are oriented lengthwise along a second direction, the second direction being different from the first direction, wherein the simultaneously forming the first series of trenches further comprises simultaneously forming the first series of trenches to a first depth, and wherein the simultaneously forming the second series of trenches further comprises simultaneously forming the second series of trenches to a second depth, the second depth being different from the first depth;
   depositing a series of conductive layers and dielectric layers within each recess of the series of recesses to form a capacitor, the capacitor comprising a plurality of conductive members integrally formed with a plurality of conductive cross members, wherein a top layer of the capacitor has a planar top surface extending from a first side of the top layer of the capacitor to a second side of the top layer of the capacitor;
   forming a first contact plug through a first conductive layer of the series of conductive layers and in contact with a first conductive line located between the base layer and the semiconductor substrate;
   forming a second contact plug through a second conductive layer of the series of conductive layers and through a third conductive layer of the series of conductive layers and in contact with a second conductive line located between the base layer and the semiconductor substrate; and
   depositing a dielectric material in physical contact with the planar top surface.

2. The method of claim 1, wherein depositing the series of conductive layers and dielectric layers within the series of recesses further comprises:
   depositing a top layer of the dielectric layers; and
   filling a remaining space within the series of recesses over the top layer of the dielectric layers with a conductive fill such that a first side of the conductive fill facing the series of recesses conforms to a profile of the series of recesses and such that a second side of the conductive fill facing away from the series of recesses is planar.

3. The method of claim 2, wherein depositing the series of conductive layers further comprises depositing layers of titanium nitride.

4. The method of claim 3, wherein depositing the dielectric layers of the series of conductive layers and dielectric layers within the series of recesses further comprises depositing a first zirconium oxide layer, an aluminum oxide layer over the first zirconium oxide layer, and a second zirconium oxide layer over the aluminum oxide layer.

5. The method of claim 1, wherein forming the second contact plug further comprises:
   etching a contact opening through the second conductive layer and the third conductive layer; and
   depositing a conductive fill material over and filling the contact opening.

6. The method of claim 1, further comprising forming a third contact plug not through a conductive layer of the capacitor and in contact with a third conductive line located between the base layer and the semiconductor substrate.

7. The method of claim 1, wherein the first series of trenches have a first pitch along the second direction and the second series of trenches have a second pitch along the first direction, the second pitch being different from the first pitch.

8. A method, comprising:
   forming a three plate capacitor within a dielectric film layer over a plurality of conductive lines of a semiconductor device, the three plate capacitor including a series of corrugated metal plates separated by insulating layers, wherein the corrugated metal plates have a grid pattern, the grid pattern being formed by a plurality of crisscross continuous trenches in a top down view, the grid pattern having a first pitch in a first direction and a second pitch in a second direction, the second pitch being different from the first pitch;
   etching a first contact opening through the dielectric film layer and through a middle plate of the three plate capacitor to expose a contact area of a first conductive line of the plurality of conductive lines;
   etching a second contact opening through the dielectric film layer, through a top plate of the three plate capacitor, and through a bottom plate of the three plate capacitor to expose a contact area of a second conductive line of the plurality of conductive lines; and
   depositing a conductive fill material over the dielectric film layer such that the conductive fill material fills the first contact opening and physically contacts each of the middle plate and the contact area of the first conductive line and such that the conductive fill material fills the second contact opening and physically contacts each of the top plate, the bottom plate and the contact area of the second conductive line.

9. The method of claim 8, wherein the forming the three plate capacitor includes:
   etching a series of recesses in a dielectric substrate layer; and
   depositing a series of conductive layers and dielectric layers within the series of recesses.

10. The method of claim 9, wherein forming the three plate capacitor further comprises depositing a top layer of the series of conductive layers to fill remaining spaces within the series of recesses.

11. The method of claim 10, wherein depositing the top layer further comprises performing a chemical mechanical planarization.

12. The method of claim 11, wherein depositing the top layer further comprises etching the top layer to offset a first end of the top layer from a first end of a middle layer of the series of conductive layers.

13. The method of claim 9, wherein forming the three plate capacitor further comprises depositing at least one layer of titanium nitride.

14. The method of claim 13, wherein depositing the dielectric layers within the series of recesses further comprises depositing a first zirconium oxide layer, an aluminum oxide layer over the first zirconium oxide layer, and a second zirconium oxide layer over the aluminum oxide layer.

15. A method comprising:
forming a metal-insulator-metal capacitor over a metallization layer of a semiconductor device, the metal-insulator-metal capacitor including a corrugated bottom plate, a corrugated middle plate, a top plate, a first insulator separating the corrugated middle plate from the corrugated bottom plate, and a second insulator separating the top plate from the corrugated middle plate, the top plate comprising a planar top surface extending from a first side of the top plate to a second side of the top plate, wherein the corrugated bottom plate comprises:
a first conductive line of a first thickness in a first trench in a top down view;
a second conductive line of a second thickness in a second trench in the top down view, the second conductive line being at a right angle to the first conductive line, the second thickness being different from the first thickness;
a third conductive line of the first thickness in a third trench in the top down view, the third conductive line being parallel to the first conductive line, wherein the first trench and the third trench are formed simultaneously; and
a fourth conductive line of the second thickness in a fourth trench in the top down view, the fourth conductive line being parallel to the second conductive line, wherein the second trench and the fourth trench are formed simultaneously, and wherein the first conductive line, the second conductive line, the third conductive line, and the fourth conductive line form a grid pattern;
forming a first conductive plug through and electrically connected to the corrugated middle plate and electrically connected to a first conductive line of the metallization layer; and
forming a second conductive plug through and electrically connected to the top plate and the corrugated bottom plate and electrically connected to a second conductive line of the metallization layer.

16. The method of claim 15 wherein forming the first conductive plug comprises forming a barrier layer through and electrically connected to the corrugated middle plate and electrically connected to the first conductive line.

17. The method of claim 16 wherein forming the first conductive plug further comprises depositing a fill material over the barrier layer.

18. The method of claim 15, wherein forming the metal-insulator-metal capacitor further comprises forming the top plate with a corrugated side facing the corrugated middle plate.

19. The method of claim 15, wherein forming the metal-insulator-metal capacitor further comprises forming the top plate, the corrugated middle plate, and the corrugated bottom plate using titanium nitride.

20. The method of claim 15, wherein the first conductive line and the second conductive line are part of a grid pattern.

* * * * *